United States Patent
Hsieh et al.

(10) Patent No.: US 7,903,017 B2
(45) Date of Patent: Mar. 8, 2011

(54) COMPARATOR FOR A PIPELINED ANALOG-TO-DIGITAL CONVERTER AND RELATED SIGNAL SAMPLING METHOD

(75) Inventors: Yi-Bin Hsieh, Taipei County (TW); Heng-Chih Lin, Hsinchu (TW)

(73) Assignee: Ralink Technology Corp., Jhubei, Hsinchu County (TW)

( * ) Notice: Subject to any disclaimer, the term of this patent is extended or adjusted under 35 U.S.C. 154(b) by 0 days.

(21) Appl. No.: 12/549,363

(22) Filed: Aug. 28, 2009

(65) Prior Publication Data
US 2011/0012765 A1 Jan. 20, 2011

(30) Foreign Application Priority Data
Jul. 16, 2009 (TW) .............................. 98124079 A

(51) Int. Cl.
*H03M 1/38* (2006.01)
(52) U.S. Cl. ........................................ 341/161; 341/155
(58) Field of Classification Search .................. 341/161, 341/156, 155, 172
See application file for complete search history.

(56) References Cited

U.S. PATENT DOCUMENTS

| | | | | | |
|---|---|---|---|---|---|
| 6,166,675 | A | * | 12/2000 | Bright | 341/162 |
| 6,909,391 | B2 | * | 6/2005 | Rossi | 341/161 |
| 7,009,549 | B1 | * | 3/2006 | Corsi | 341/161 |

OTHER PUBLICATIONS

Iuri Mehr and Larry Singer, A 55-mW, 10-bit, 40-Msample/s Nyquist-Rate CMOS ADC, Mar. 2000.

* cited by examiner

*Primary Examiner* — Brian Young
(74) *Attorney, Agent, or Firm* — Winston Hsu; Scott Margo

(57) ABSTRACT

A comparator for a pipelined ADC includes a sampling circuit coupled to a plurality of differential input voltages and a plurality of differential reference voltages, for sampling the plurality of differential input voltages according to a first clock signal and sampling the plurality of differential reference voltages according to a second clock signal, a preamplifier coupled to the sampling circuit comprising a positive input terminal, a negative input terminal, a positive output terminal, and a negative output terminal, for amplifying a voltage across the positive input terminal and the negative input terminal for generating a plurality of differential output voltages, and a latch circuit coupled to the preamplifier for latching the plurality of differential output voltages.

14 Claims, 9 Drawing Sheets

COMPARATOR FOR A PIPELINED ANALOG-TO-DIGITAL CONVERTER AND RELATED SIGNAL SAMPLING METHOD

BACKGROUND OF THE INVENTION

1. Field of the Invention

The present invention relates to a comparator for a pipelined analog-to-digital converter (ADC) and related signal sampling method, and more particularly, to a comparator that performs a sample-and-hold function as a front-end sample-and-hold amplifier in the pipelined ADC and related signal sampling method.

2. Description of the Prior Art

An analog-to-digital converter (ADC) converts an analog signal into a digital signal, and is frequently used in industrial measurement, communication system, and audio/video data processing. ADCs are implemented in the several types including flash ADC, successive approximation ADC, sigma-delta ADC, and pipelined ADC, which are recognized by different sampling rate and resolution. A pipelined ADC can provide both high sampling rate and high resolution, and is widely used in communication system.

Please refer to FIG. 1, which is a block diagram of a 10-bit pipelined ADC 10 according to the prior art. The pipelined ADC 10 includes a sample-and-hold amplifier 100, subsequent stages 102_1-102_8 following the sample-and-hold amplifier (SHA) 100, a flash ADC 104, and an error correction circuit 106. The subsequent stages 102_1 to 102_8 are similar, and only the subsequent stage 102_1 is illustrated as follows. The subsequent stage 102_1 includes a sub-ADC 10, a digital-to-analog converter (DAC) 112, a sample-and-hold unit 114, a subtractor 116, and an amplifier 118, where the DAC 112, the sample-and-hold unit 114, the subtractor 116, and the amplifier 118 consist of a multiplying DAC.

Note that, the front-end sample-and-hold amplifier 100 is used to convert input analog signals into DC-like signals, such that quantization output of the sub-ADC 110 is not influenced easily by noise. However, the sample-and-hold amplifier 100 also brings distortion to the input analog signal of the sub-ADC 110, and costs large power consumption in the pipelined ADC 10. If the sample-and-hold amplifier 100 is not used, when the input analog signal is higher than tens of MHz, sampling points of the sub-ADC 110 may be different from that of the rear-stage multiplying DAC, which causes aperture error, and resolution of the pipelined ADC 10 is therefore reduced.

There are some conventional methods that omit the front-end sample-and-hold amplifier and also reserve the ample-and-hold effect, such as "A 55-mW, 10-bit, 40-Msample/s Nyquist-Rate CMOS ADC" by Iuri Mehr and Larry Singer, published in IEEE Journal of Solid-State Circuits, vol. 35, no. 3., which implements functions of the front-end sample-and-hold amplifier into the first subsequent stage of a pipelined ADC. Please refer to FIG. 2, which is a schematic diagram of the first subsequent stage 20 of the pipelined ADC disclosed in the mentioned paper. The first subsequent stage 20 includes a sub-ADC 200 and a multiplying DAC 210. The sub-ADC 200 includes two similar comparators 201, 202, and a logic circuit 204, where detail of the comparator 202 is illustrated in FIG. 3. In FIG. 2, the pipelined ADC 210 is illustrated as a single-ended architecture for a simplified presentation, and in fact, the pipelined ADC 210 is a fully differential architecture.

As shown in FIG. 3, the comparator 202 includes a preamplifier 206, a latch circuit 208, switches S1A, S1B, S2A, S2B, S3A, S3B, S4A, S4B, SZ1, SZ2, and capacitors C1-C4, wherein these switches and capacitors forms a switched capacitor circuit, as a sampling circuit, and reference voltages $V_{TH1P}$, $V_{TH1N}$, and a common mode voltage $V_{CM}$ are used in the switched capacitor circuit. The preamplifier 206 consists of transistors M1-M6. The multiplying DAC 210 includes a DAC 212, an amplifier 214, switches SM1-SM5, and capacitors CM1 and CM2. For a pipelined ADC of a 1.5-bit/stage architecture, the multiplying DAC 210 requires a positive reference voltage $V_{REFP}$, a negative reference voltage $V_{REFN}$ and the common mode voltage $V_{CM}$. The reference voltage $V_{TH1P}$ that the switched capacitor circuit uses is equal to ¼ $V_{REFP}$, and the reference voltage $V_{TH1N}$ is equal to ¼$V_{REFN}$. Through the switched capacitor circuit, two threshold voltages, +¼ ($V_{REFP}-V_{REFN}$) and -¼ ($V_{REFP}-V_{REFN}$), are generated for the comparison of the comparator 202. As shown in FIG. 3, non-overlapping clock signals $\Phi_1$ and $\Phi_2$ are used as sampling clocks for two adjacent subsequent stages. Falling edges of clock signals $\Phi_{1d}$ and $\Phi_{2d}$ are later than falling edges of the clock signals $\Phi_1$ and $\Phi_2$, respectively. A clock signal $\Phi_{2c}$ is a delay clock of the clock signal $\Phi_{2d}$.

When in a sampling phase, the clock signal $\Phi_1$ is at a high voltage level, and the switches S1A, S2A, S3A, and S4A are turned on. In this situation, the reference voltages $V_{TH1P}$ and $V_{TH1N}$ are respectively sampled to the capacitors C1-C4, differential input voltages $V_{INP}$ and $V_{INN}$ are sampled to the capacitors C2 and C3, and the switches SZ1 and SZ2 are turned on in order to cancel a DC offset voltage across differential input terminals of the preamplifier 206. In the multiplying DAC 210, an input voltage $V_{IN}$ is sampled to the capacitors CM1 and CM2 when the clock signal $\Phi_{1d}$ is at a high voltage level.

When in a holding phase, the clock signal $\Phi_{2d}$ is at a high voltage level, and the switches S1B, S2B, S3B, and S4B are turned on. In this situation, a voltage ($V_{INP}-V_{INN}$) is compared to the threshold voltages +¼ ($V_{REFP}-V_{REFN}$) and -¼ ($V_{REFP}-V_{REFN}$), and the voltage across the differential input terminals of the preamplifier 206 indicates a comparison result. The preamplifier 206 amplifies the voltage across the differential input terminals, and the latch circuit 208 latches differential output voltages of the preamplifier 206 at the rising edge of the clock signal $\Phi_{2c}$. Next, the logic circuit 204 generates a 2-bit digital signal as 00, 10, or 11, which indicates different comparison result, according to output voltages latched by the latch circuits of the comparators 200 and 202. In the multiplying DAC 210, the DAC 212 outputs the reference voltages $V_{REFP}$, $V_{REFN}$, or $V_{CM}$ to the capacitor CM2 according to the 2-bit digital signal outputted from the logic circuit 204. Briefly, the multiplying DAC 210 amplifies the input voltage $V_{IN}$ and subtracts the outputted reference voltage (which is $V_{REFP}$, $V_{REFN}$, or $V_{CM}$) from the input voltage $V_{IN}$, to generate a residue voltage $V_{OUT}$ that is outputted to a next subsequent stage.

From the above, the time when the preamplifier 206 performs amplification is between the rising edge of the clock signal $\Phi_{2d}$ and the rising edge of the clock signal $\Phi_{2c}$, shown as $T_d$ in FIG. 3. In order to prevent the aperture error, a time constant of the switched capacitor circuit in the sub-ADC 200 has to be equal to a time constant of the switched capacitor circuit in the multiplying DAC 210. In other words, resistors and capacitors used in switched capacitor circuits in both sides should fulfill the following equation:

$$R_M C_M = \frac{C_1}{G_m + 1/R_C} \approx \frac{C_1}{G_m}, \qquad (1)$$

where $R_M$ indicates the equivalent resistance of the switch SM1 or SM2; $C_M$ indicates the equivalent capacitance of the capacitor CM1 or CM2; $G_m$ is the transconductance of the transistor in the preamplifier 206; $R_C$ is the equivalent resistance of the switch in the switched capacitor circuit of the sub-ADC 200. In high-speed applications, the above resistance $R_C$ or $R_M$ is quite small, so that the transconductance $G_m$ should be large enough to make both sides of the equation 1 to be equal, i.e., the time constants are matched. Note that, a large transconductance $G_m$ causes rise of power consumption of the comparator 202. Also, it is difficult to obtain the matched time constants through adjusting the transconductance of a transistor because the transconductance is not easy to be controlled.

SUMMARY OF THE INVENTION

It is therefore a primary objective of the present invention to provide a comparator for a pipelined ADC and related signal sampling method.

The present invention discloses a comparator for a pipelined ADC that includes a sampling circuit coupled to a plurality of differential input voltages and a plurality of differential reference voltages, for sampling the plurality of differential input voltages according to a first clock signal and sampling the plurality of differential reference voltages according to a second clock signal, a preamplifier coupled to the sampling circuit comprising a positive input terminal, a negative input terminal, a positive output terminal, and a negative output terminal, for amplifying a voltage across the positive input terminal and the negative input terminal for generating a plurality of differential output voltages, and a latch circuit coupled to the preamplifier for latching the plurality of differential output voltages.

The present invention further discloses a signal sampling method for a pipelined ADC, wherein a comparator of the first subsequent stage of the pipelined ADC includes a sampling circuit including a plurality of input voltage sampling switches, a plurality of reference voltage sampling switches, and a plurality of capacitors. The signal sampling method includes controlling the plurality of input voltage sampling switches according to a first clock signal to sample a plurality of differential input voltages on the plurality of capacitors, and controlling the plurality of reference voltage sampling switches according to a second clock signal to sample a plurality of differential reference voltages on the plurality of capacitors, wherein the first clock signal and the second signal are non-overlapping signals.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
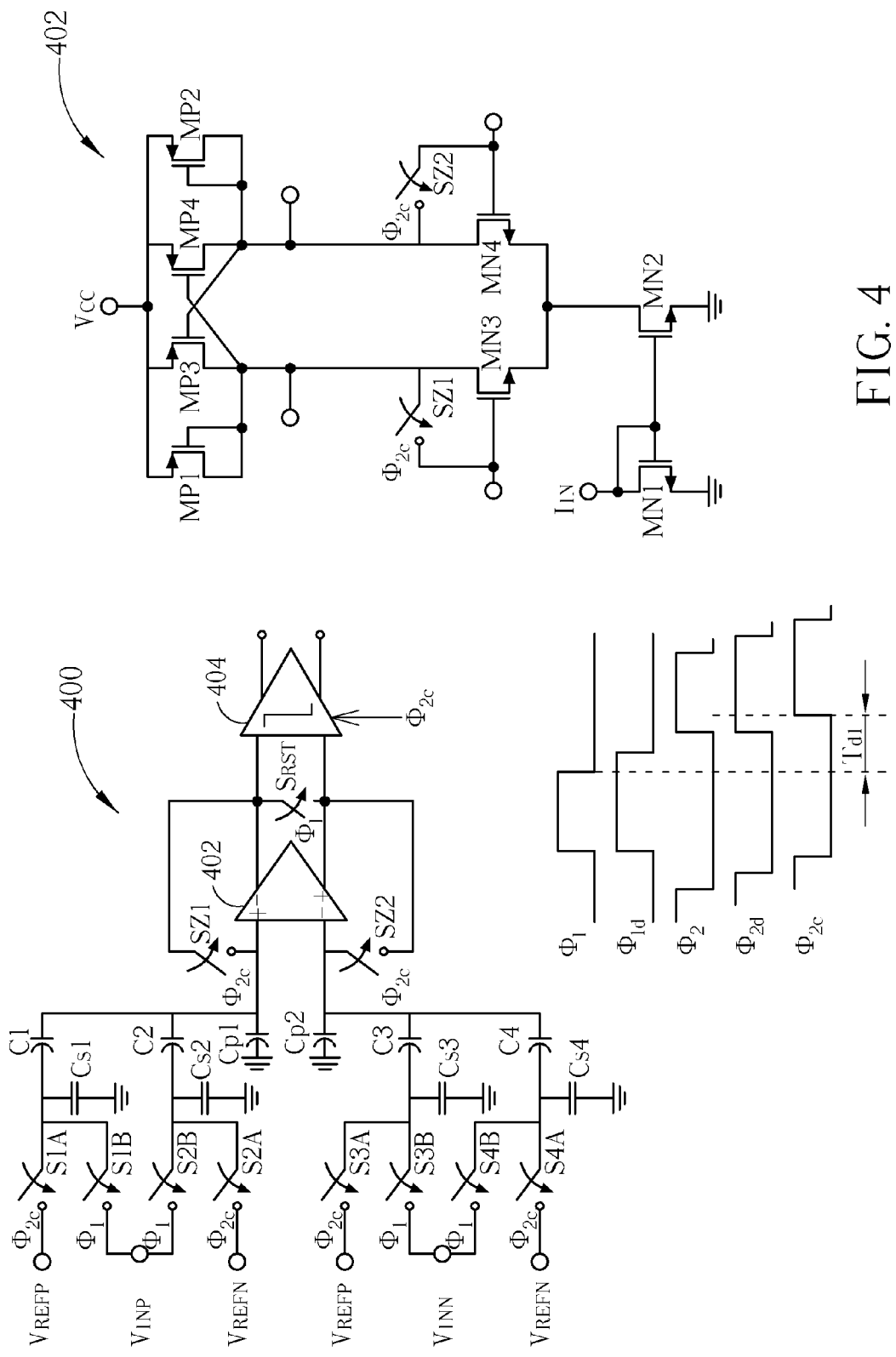
FIG. 4 is a schematic diagram of a comparator according to an embodiment of the present invention.

Please refer to FIG. 4, which is a schematic diagram of a comparator 400 according to an embodiment of the present invention. The comparator 400 performs functions as a sample-and-hold amplifier, and is used in a 1.5-bit sub-ADC. When the first subsequent stage of a pipelined ADC applies the comparator 400, the pipelined ADC does not require using a front-end sample-and-hold amplifier, i.e., cost of the pipelined ADC can be reduced.

The comparator 400 comprises a preamplifier 402, a latch circuit 404, switches S1A, S1B, S2A, S2B, S3A, S3B, S4A, S4B, SZ1, SZ2, and $S_{RST}$, capacitors C1-C4, and capacitors Cs1-Cs4. Compared to the conventional comparator 202 in FIG. 3, the capacitors Cs1-Cs4 and the switch $S_{RST}$ are added. The capacitors Cs1-Cs4 is sampling capacitors, where the capacitance of Cs1-Cs4 can be small and occupy small area. The switches S1A, S1B, S2A, S2B, S3A, S3B, S4A, S4B, the capacitors C1-C4, and Cs1-Cs4 forms a switched capacitor circuit, also called a sampling circuit. A positive input voltage $V_{INP}$ and a negative input voltage $V_{INN}$ are differential input voltages of the comparator 400, and other reference voltages coupled to the switched capacitor circuit are generated by a reference voltage generator of the pipelined ADC. Each switch in the switched capacitor circuit is utilized for controlling a signal connection between a reference voltage (or an input voltage) and one of the sampling capacitor Cs1-Cs4 according to different clock signal, in order to sample the reference voltage (or the input voltage) on the sampling capacitor.

Components in the switched capacitor circuit are described as follows. The switch S1A is coupled to a positive reference voltage $V_{REFP}$; the switch S1B is coupled to the positive input voltage $V_{INP}$; one terminal of the capacitor C1 is coupled to the switches S1A and S1B, and another terminal of the capacitor C1 is coupled to an positive input terminal of the preamplifier 402; one terminal of the capacitor Cs1 is coupled to the switches S1A, S1B, and the capacitor C1, and another terminal of the capacitor Cs1 is coupled to a ground. The switch S2A is coupled to a negative reference voltage $V_{REFN}$; the switch S2B is coupled to the positive input voltage $V_{INP}$; one terminal of the capacitor C2 is coupled to the switches S2A and S2B, and another terminal of the capacitor C2 is coupled to the positive input terminal of the preamplifier 402; one terminal of the capacitor Cs2 is coupled to the switches S2A, S2B, and the capacitor C2, and another terminal of the capacitor Cs2 is coupled to the ground. The switch S3A is coupled to the positive reference voltage $V_{REFP}$; the switch S3B is coupled to the negative input voltage $V_{INN}$; one terminal of the capacitor C3 is coupled to the switches S3A and S3B, and another terminal of the capacitor C3 is coupled to an negative input terminal of the preamplifier 402; one terminal of the capacitor Cs3 is coupled to the switches S3A, S3B, and the capacitor C3, and another terminal of the capacitor Cs3 is coupled to the ground. The switch S4A is coupled to the negative reference voltage $V_{REFN}$; the switch S4B is coupled to the negative input voltage $V_{INN}$; one terminal of the capacitor C4 is coupled to the switches S4A and S4B, and another terminal of the capacitor C4 is coupled to the negative input terminal of the preamplifier 402; one terminal of the capacitor Cs4 is coupled to the switches S4A, S4B, and the capacitor C4, and another terminal of the capacitor Cs4 is coupled to the ground. As shown in FIG. 4, the clock signals for controlling these switches are denoted beside the switches, which are described in detail later.

Note that, reference voltages used in the switched capacitor circuit of the comparator 400 are the positive reference voltage $V_{REFP}$ and the negative reference voltage $V_{REFN}$. Threshold voltages used for comparison are +¼ ($V_{REFP}$–$V_{REFN}$) and –¼ ($V_{REFP}$–$V_{REFN}$), which are designed according to an ratio related to the capacitance of the capacitor C1-C4. According to the present invention, when the capacitor C1 and the capacitor C4 have the same capacitance, the capacitor C2 and the capacitor C3 have the same capacitance, and C1:C2=5:3, the threshold voltages +¼ ($V_{REFP}$–$V_{REFN}$) and –¼ ($V_{REFP}$–$V_{REFN}$) are therefore generated. Compared with the comparator 202 in FIG. 3, the comparator 400 does not require using additional reference voltages as $V_{TH1P}$ and $V_{TH1N}$ and only uses the reference voltages $V_{REFP}$ and $V_{REFN}$ to generate these threshold voltages. Since the reference voltage generator of the pipelined ADC does not need to generate additional reference voltages, power consumption of the pipelined ADC is reduced.

Please refer to FIG. 4 again for the detail of the preamplifier 402. The preamplifier 402 comprises n-type transistors MN1-MN4 and p-type transistors MP1-MP4, which are utilized for amplifying the voltage across the positive input terminal and the negative input terminal of the preamplifier 402, for generating differential output voltages. The transistors MN1-MN4 and MP1-MP4 are metal-oxide-semiconductor field effect transistors (MOSFET), for example. Capacitors Cp1 and Cp2 shown in FIG. 4 are parasitic capacitors on differential input terminals of the preamplifier 402. The transistors MN1 and MN2 consist of a current mirror. The drain of the transistor MN1 is coupled to the gate of itself and a current source $I_{IN}$, and the source of the transistor MN1 is coupled to the ground. The gate of the transistor MN2 is coupled to the gate of the transistor MN1, the source of the transistor MN2 is coupled to the ground, and the drain of the transistor MN2 is coupled to the source of the transistor MN3 and the source of the transistor MN4.

The gate of the transistor MN3 is the positive input terminal of the preamplifier 402, and the gate of the transistor MN4 is the negative input terminal of the preamplifier 402. The sources of the transistors MP1-MP4 are all coupled to a voltage source $V_{CC}$. The gate of the transistor MP1 is coupled to the drain of itself, the drain of the transistor MP3, and the drain of the transistor MN3, which is the negative output terminal of the preamplifier 402. The gate of the transistor MP2 is coupled to the drain of itself, the drain of the transistor MP4, and the drain of the transistor MN4, which is also the positive output terminal of the preamplifier 402. In addition, the gate of the transistor MP3 is coupled to the drain of the transistor MP4, and the gate of the transistor MP4 is coupled to the drain of the transistor MP3, which forms an active load that makes gain and bandwidth of the preamplifier 402 to be adjusted more easily.

The switches SZ1 and SZ2 are utilized for cancelling a DC offset voltage across the differential input terminals of the preamplifier 402, where the switch SZ1 is coupled between the positive input terminal and the negative output terminal of the preamplifier 402, and the switch SZ2 is coupled between the negative input terminal and the positive output terminal of the preamplifier 402. The switch $S_{RST}$ is coupled between the positive output terminal and the negative output terminal of the preamplifier 402, and is utilized for resetting the differential output voltages of the preamplifier 402. The latch circuit 404 is coupled to the positive output terminal and the negative output terminal of the preamplifier 402, and is utilized for latching the differential output voltages of the preamplifier 402.

Figure 5:
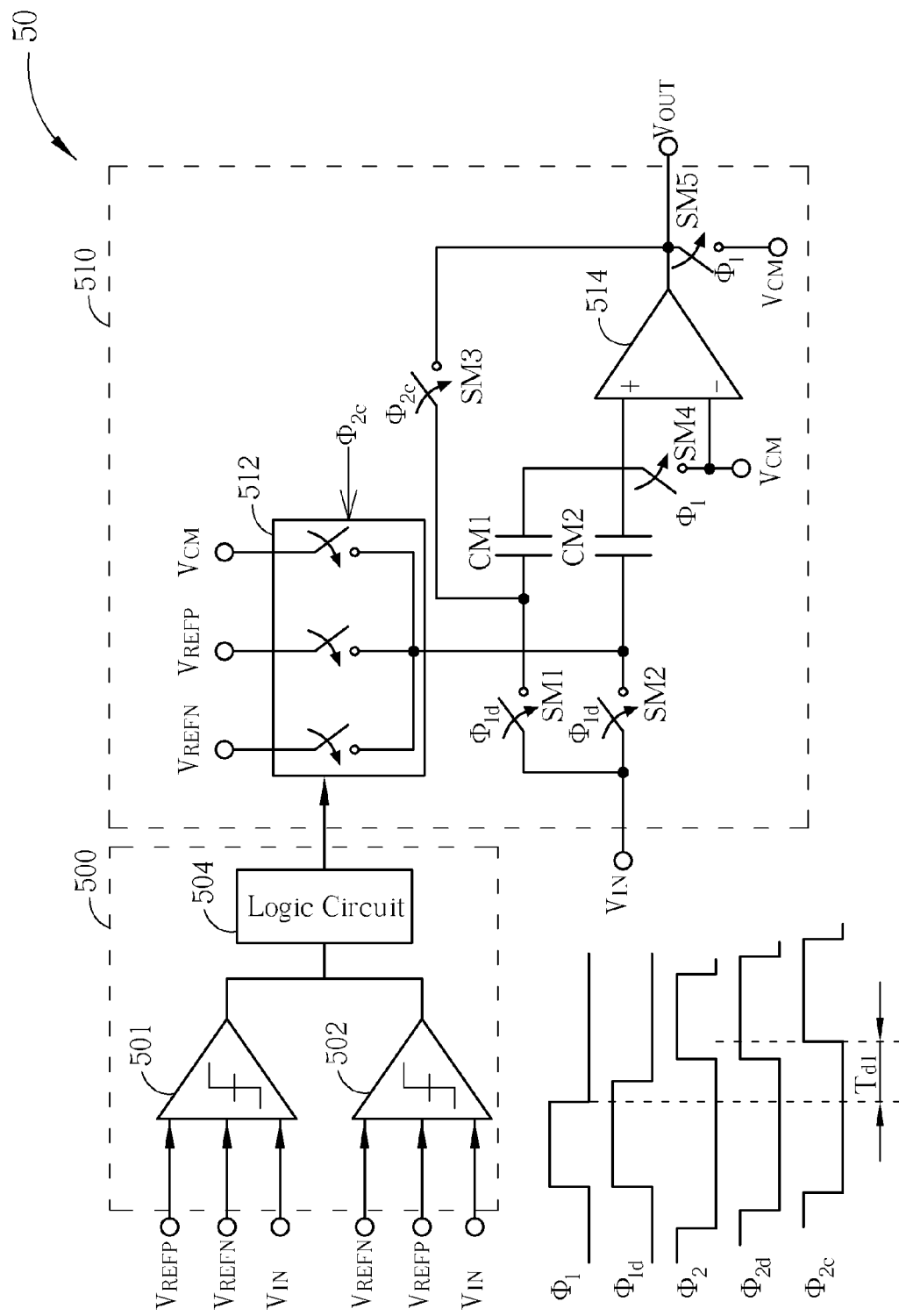
FIG. 5 is a schematic diagram of a subsequent stage of a pipelined ADC according to an embodiment of the present invention.

Please refer to FIG. 5, which is a schematic diagram of a subsequent stage 50 of a pipelined ADC according to an embodiment of the present invention. The subsequent stage 50 is the first subsequent stage 50 of the pipelined ADC, comprising a 1.5-bit sub-ADC 500 and a multiplying DAC 510. The sub-ADC 500 comprises comparators 501, 502, and a logic circuit 504. The comparators 501 and 502 are similar to the comparator 400 in FIG. 4 with inverse reference voltage connection. In the following description, only the comparators 501 is described since those skilled in the art can understand how the comparators operate when one of them is already known. The logic circuit 504 is coupled to the comparators 501 and 502, and is utilized for generating a 2-bit digital signal as 01, 10, or 00 according to the voltages latched by the latch circuits of the comparators 501 and 502.

The multiplying DAC 510 comprises a DAC 512, an amplifier 514, switches SM1-SM5, capacitors CM1, and CM2. Note that, the multiplying DAC 510 shown in FIG. 5 is a single-ended architecture for a simplified presentation, where the multiplying DAC 510 is a fully differential architecture, in fact. The switches SM1, SM2, the capacitors CM1, and CM2 forms a switched capacitor circuit operating as a sampling circuit, where the switch SM1 is coupled to the capacitor CM1, and the switch SM2 is coupled to the capacitor CM2. The DAC 512 is coupled to the logic circuit 504 and the capacitor CM2, and is utilized for outputting the voltages $V_{REFP}$, $V_{REFN}$, or $V_{CM}$ to the capacitor CM2 according to the 2-bit digital signal generated by the logic circuit 504. The amplifier 514 comprises a positive input terminal coupled to the capacitors CM1 and CM2, a negative input terminal coupled to the common mode voltage $V_{CM}$, and an output terminal coupled to comparators in a sub-ADC in a next subsequent stage, wherein output voltages of the amplifier 514 are input voltages of the comparators in the next subsequent stage. The switch SM3 is coupled between the output terminal of the amplifier 514 and the capacitor CM1. The switch SM4 is coupled between the positive input terminal and the negative input terminal of the amplifier 514. The switch SM5 is coupled between the output terminal of the amplifier 514 and the common mode voltage $V_{CM}$.

The clock signals used in the pipelined ADC are denoted as $\Phi_1$, $\Phi_2$, $\Phi_{1d}$, $\Phi_{2d}$, and $\Phi_{2c}$, as shown in FIG. 4 and FIG. 5, and are generated by a clock generator of the pipelined ADC. The clock signals $\Phi_1$ and $\Phi_2$ are non-overlapping sampling signals for two adjacent subsequent stage. The rising edge of the clock signals $\Phi_{1d}$ and $\Phi_{2d}$ are the same time as the rising edge of the clock signals $\Phi_1$ and $\Phi_2$, and the falling edge of the clock signals $\Phi_{1d}$ and $\Phi_{2d}$ is later than the falling edge of the clock signal $\Phi_1$ and $\Phi_2$. The clock signal $\Phi_{2c}$ is a delay clock of the clock signal $\Phi_{2d}$. Note that, the way of the switches being coupled to the reference voltages and the input voltages according to the present invention is different from that in the conventional switched capacitor circuit, and the way of using the clock signals is different, so that the comparator according to the present invention brings effects different from the conventional comparator.

Please refer to FIG. 4 and FIG. 5. When the clock signal $\Phi_{2c}$ is at a high voltage level, the switches S1A, S2A, S3A, and S4A are turned on and other switches are turned off, so that the positive reference voltage $V_{REFP}$ is sampled to the capacitors C1, Cs1, C3, and Cs3, and the negative reference voltage $V_{REFN}$ is sampled to the capacitors C2, Cs2, C4, and Cs4. At the same time, the switches SZ1 and SZ2 are turned on, so that the DC offset voltage across the differential input terminals of the preamplifier 402 is zeroed. The logic circuit 504 outputs the 2-bit digital signal 00, 01, or 10 to the DAC 512 according to the voltages latched by the latch circuits of the comparators 501 and 502 at the rising edge of the clock signal $\Phi_{2c}$. The DAC 512 outputs a corresponding one of the voltages $V_{REFP}$, $V_{REFN}$, or $V_{CM}$ to the capacitor CM2 according to the 2-bit digital signal. When the clock signal $\Phi_{2c}$ is at a high voltage level, the switch SM3 is turned on, and the capacitor CM1 and the amplifier 514 form a negative feedback path. After the input voltage $V_{IN}$ is amplified, the output voltage of the DAC 512 is subtracted from the amplified input voltage, and then a residue voltage is generated, outputted to a next subsequent stage.

When the clock signal $\Phi_1$ is at a high voltage level, the switches S1B, S2B, S3B, and S4B are turned on and other switches are turned off, so that the positive input voltage $V_{INP}$ is sampled to the capacitors Cs1, Cs2, and a serial capacitor formed by the capacitors C1, C2, and Cp1, and similarly, the negative input voltage $V_{INN}$ is sampled to the capacitors Cs3, Cs4, and a serial capacitor formed by the capacitors C3, C4, and Cp2. At the same time, the switch $S_{RST}$ is turned on to reset the differential output voltages of the preamplifier 402, and therefore the recovery time of the comparator 400 is reduced. For the multiplying DAC 510, when the clock signal $\Phi_1$ is at a high voltage level, the switches SM4 and SM5 are turned on, so that the differential input terminals of the amplifier 514 are pulled to the common mode voltage $V_{CM}$. In addition, when the clock signal $\Phi_{1d}$ is at a high voltage level, the switches SM1 and SM2 are turned on, so that the input voltage of the multiplying DAC 510 are sampled to the capacitors CM1 and CM2.

Figure 1:
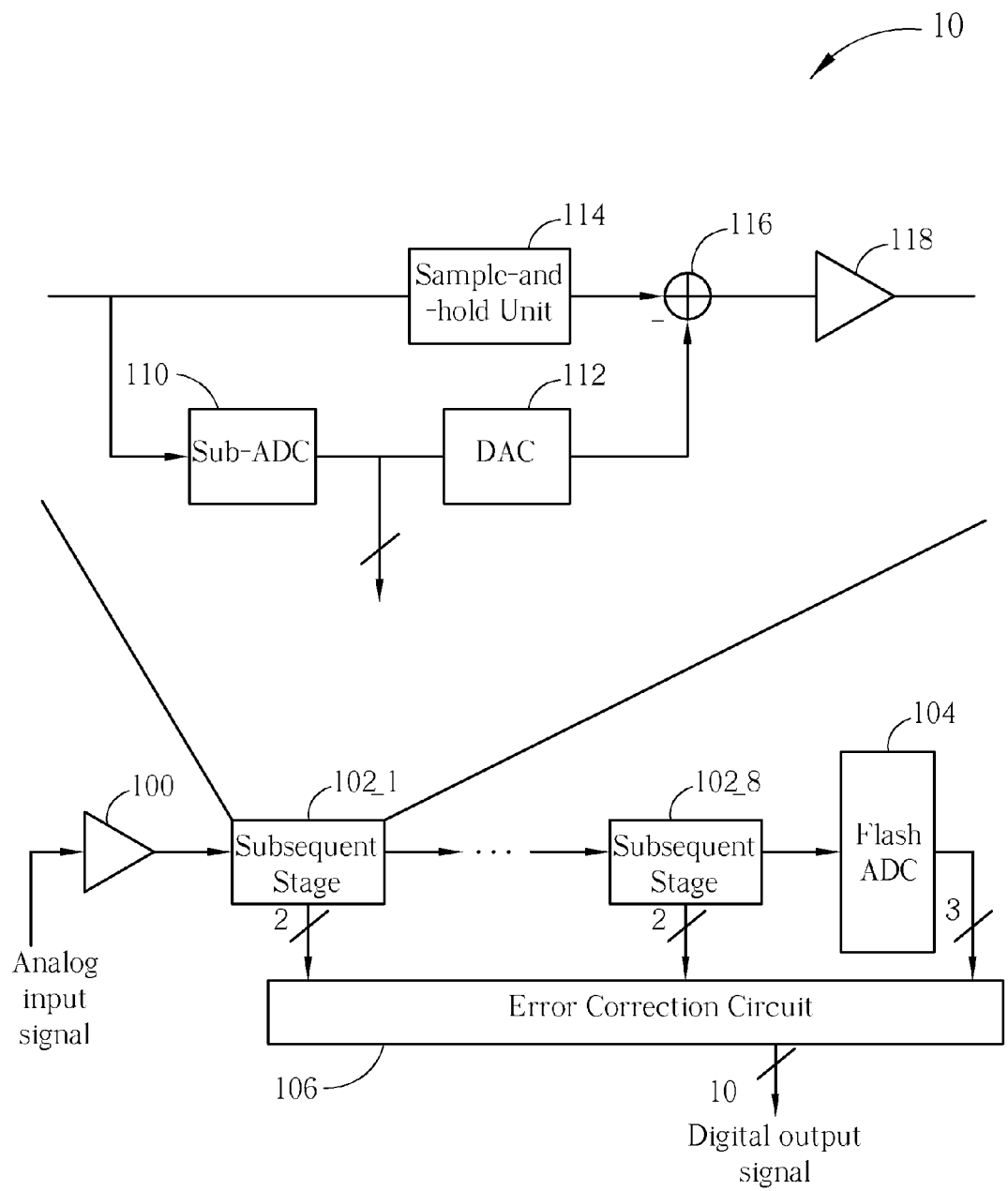
FIG. 1 is a block diagram of a 10-bit pipelined ADC according to the prior art.
Figure 2:
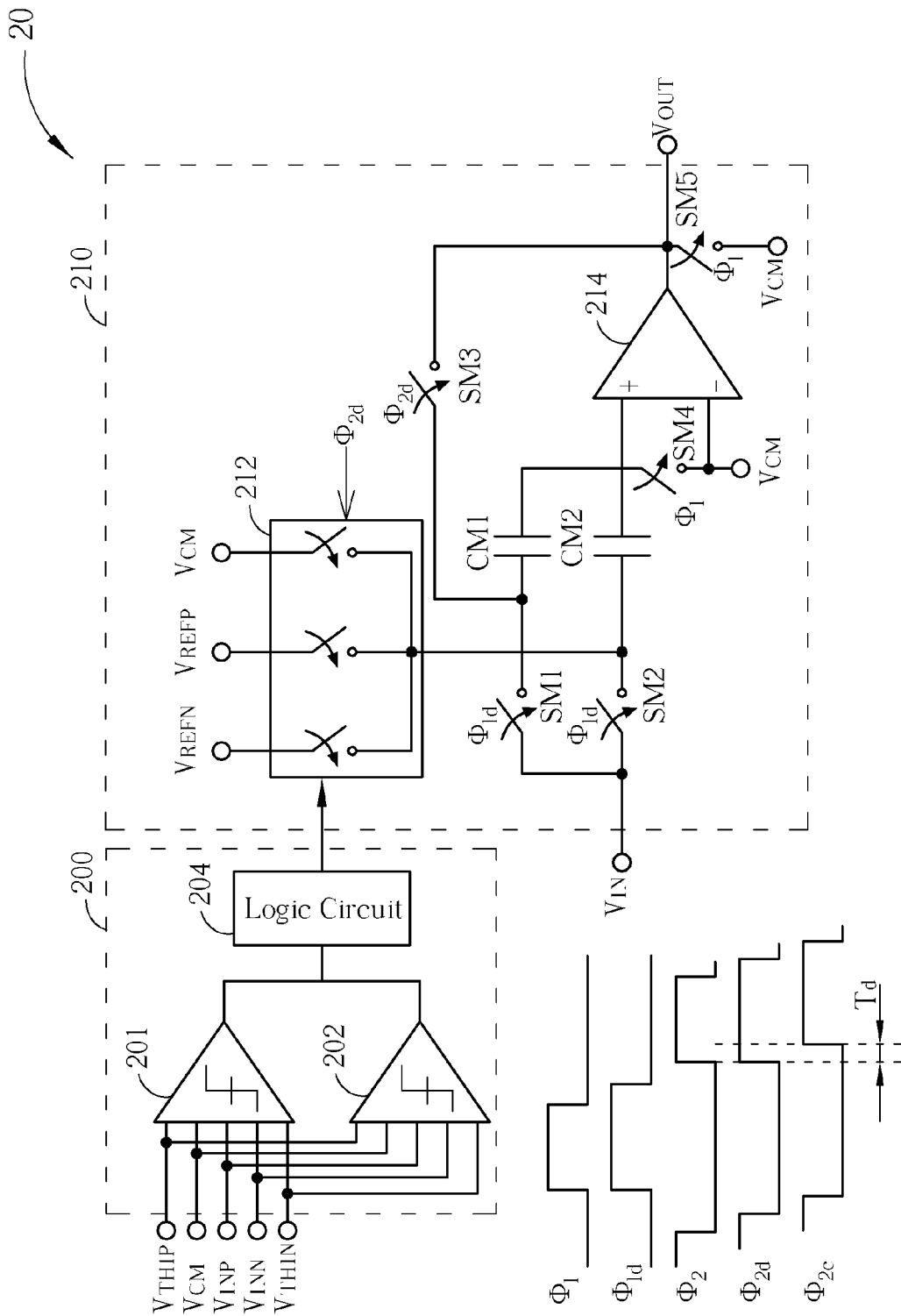
FIG. 2 is a schematic diagram of the first subsequent stage of a pipelined ADC according to the prior art.
Figure 3:
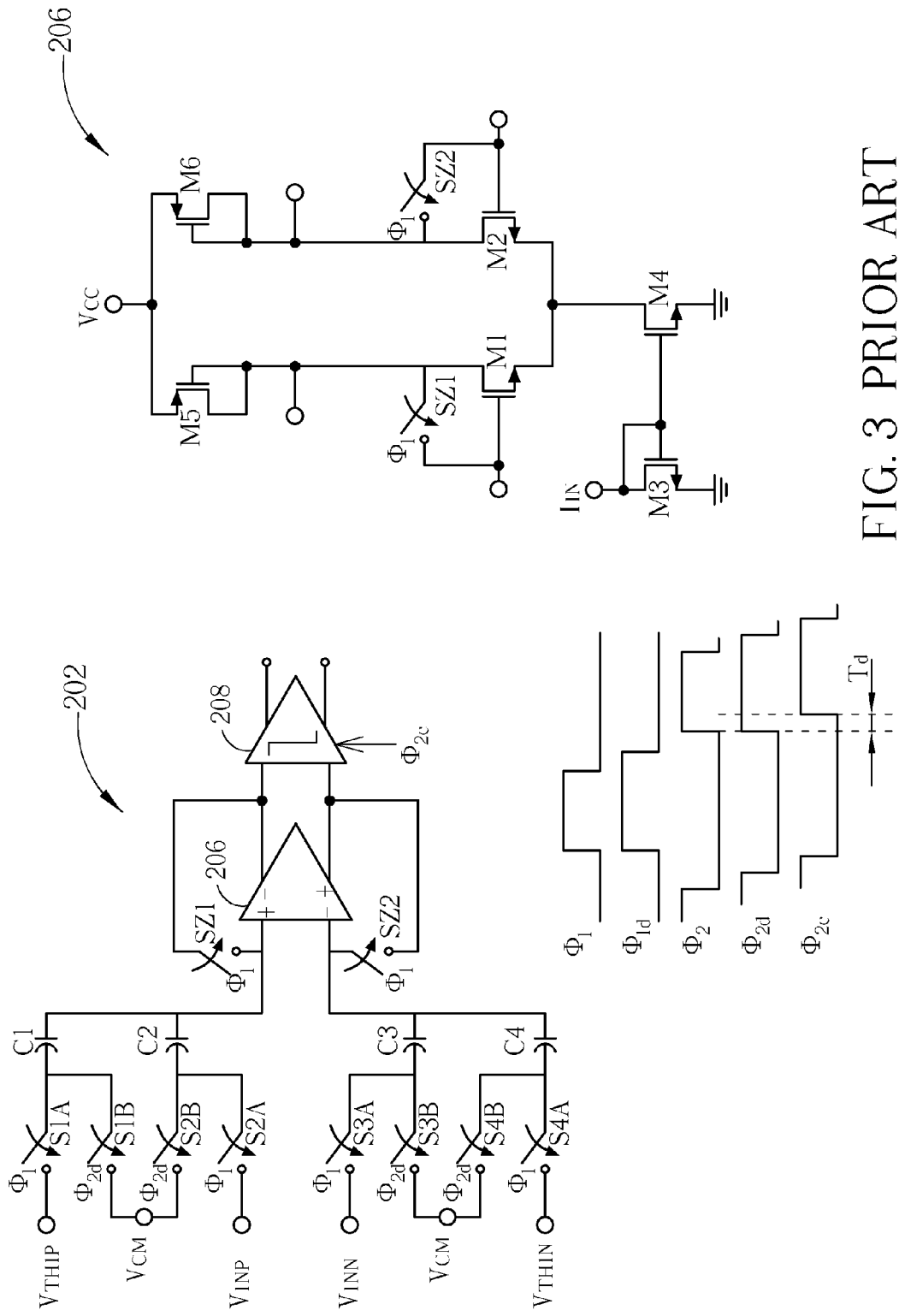
FIG. 3 is a schematic diagram of a comparator in FIG. 2.

At the falling edge of the clock signal $\Phi_1$, the voltage difference ($V_{INP}-V_{INN}$) is compared to the threshold +¼ ($V_{REFP}-V_{REFN}$) and -¼ ($V_{REFP}-V_{REFN}$). That is, the sampled voltage difference ($V_{INP}-V_{INN}$) is quantized with two threshold level. The preamplifier 402 amplifies the voltage across the differential input terminals and outputs an amplified voltage across the differential output terminals, which indicates a comparison result, to the latch circuit 404. The latch circuit 404 latches the differential output voltages of the preamplifier 402 at the rising edge of the clock signal $\Phi_{2c}$. From the above, it is known that the preamplifier 402 performs amplification when a time between the falling edge of the clock signal $\Phi_1$ and the rising edge of the clock signal $\Phi_{2c}$, as $T_{d1}$ shown in FIG. 4. As shown in FIG. 3, in the conventional comparator 202, the preamplifier 206 performs amplification only when a time $T_d$ between the rising edge of the clock signal $\Phi_{2d}$ and the rising edge of the clock signal $\Phi_{2c}$. In comparison, the preamplifier 402 has the operation time $T_{d1}$ longer than $T_d$. Therefore, the preamplifier 402 has more time to amplify the voltage difference across the differential input terminals to reach an enough voltage level, so that the logic circuit has less opportunity to output a wrong signal.

Furthermore, to avoid aperture error, the switched capacitor circuit of the comparator 501 (or 502) and the switched capacitor circuit of the multiplying DAC 510 should provide the same time constant. Assume that the capacitances of the capacitors Cs1-Cs4 are equal, denoted as Cs, the capacitances of the capacitors Cp1 and Cp2 are equal, denoted as Cp, the capacitances of the capacitors C1 and C4 are equal, the capacitances of the capacitors C2 and C3 are equal, and the sum of the capacitances of C1 and C2 is far large than the capacitance Cp, the resistances and capacitances used in the switched capacitor circuit need to be fulfilled as the following:

$$R_M C_M = R_C\left(2C_S + \frac{(C_1 + C_2)C_p}{C_1 + C_2 + C_p}\right) \approx R_C(2C_S + C_p), \quad (2)$$

when the capacitance Cs is far large than the capacitance Cp, the equation 2 is simplified as:

$$R_M C_M \approx 2 R_C C_S, \quad (3)$$

where $R_M$ is the equivalent resistance of the switch SM1 or SM2 in the multiplying DAC 510, $C_M$ is the capacitance of the capacitor CM1 or CM2, and $R_C$ is the equivalent resistance of the switch in the switched capacitor circuit of the comparator 501 or 502. From the above, the present invention uses a clock signal control scheme different from the prior art, and uses the additional sampling capacitors Cs1-Cs4, to control the time constant of the switched capacitor circuit of the comparator to be not effected by the transconductance of the transistor in the preamplifier. According to the present invention, when the capacitors and the switches in the switched capacitor circuit are properly designed, the time constants for the comparators 501 and for the multiplying DAC 510 can be easily matched without adjusting the transconductance of the transistor in the preamplifier, and thereby the aperture error is not generated.

Briefly, when the first subsequent stage of a pipelined ADC uses the comparator 400, a front-end sample-and-hold amplifier in front of the first subsequent stage is not required. The time for the preamplifier 402 to perform amplification is longer than that for the conventional preamplifier, so that the possibility of the logic circuit outputting a wrong signal is reduced. The time constant of the switched capacitor circuit of the comparator 400 is related to the capacitance and the equivalent resistance of the switch, and is not related to the transconductance of the transistor, which brings an easy way to control the aperture error. In addition, the reference voltage generator of the pipelined ADC does not require generating additional reference voltages for the comparator 400 as for the conventional comparator in FIG. 3, and therefore power consumption of the pipelined ADC is reduced.

Figure 6:
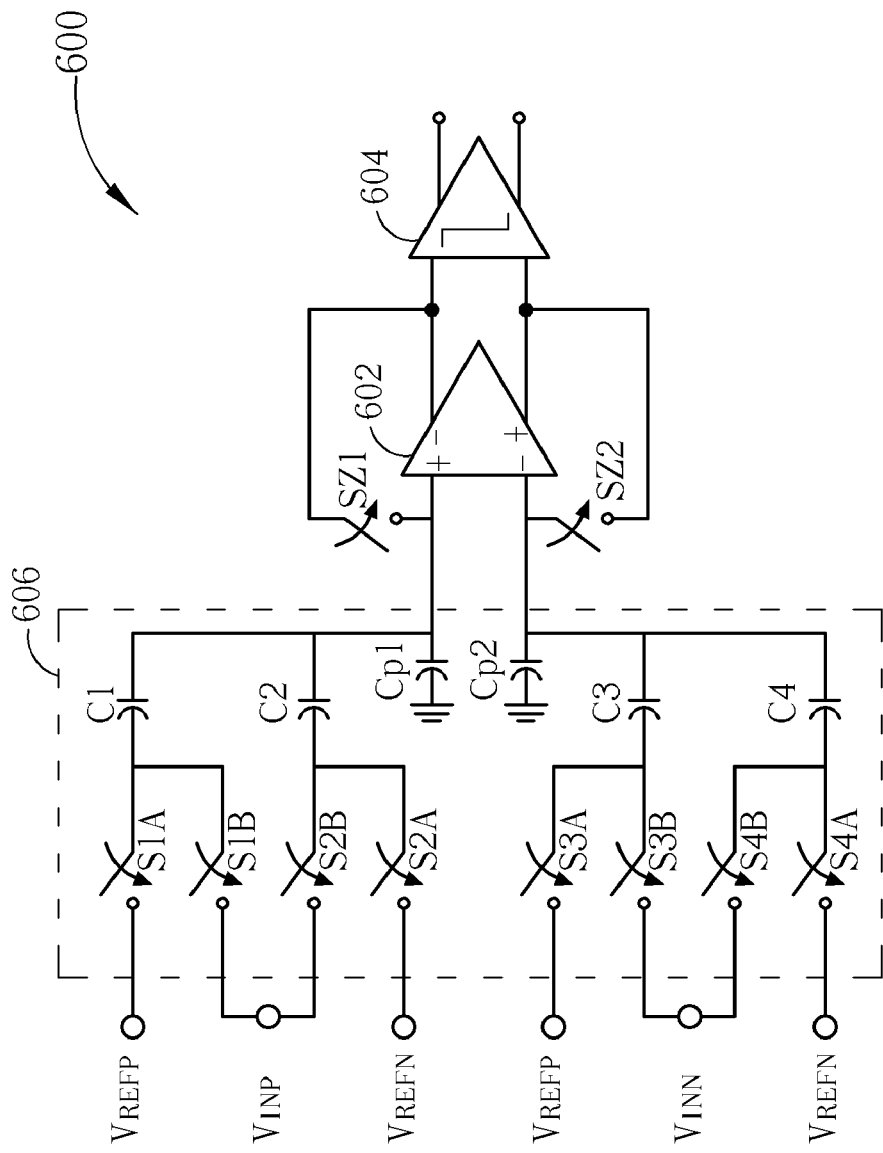
FIG. 6 is a schematic diagram of a comparator according to an embodiment of the present invention.

Please refer to FIG. 6, which is a schematic diagram of a comparator 600 according to an embodiment of the present invention. The comparator 600 is used in a subsequent stage other than the first subsequent stage of a pipelined ADC. The comparator 600 comprises a preamplifier 602, a latch circuit 604, and a switched capacitor circuit 606. The switched capacitor circuit 606 comprises switches S1A, S1B, S2A, S2B, S3A, S3B, S4A, S4B, SZ1, SZ2, and capacitors C1-C4. Compared to the comparator 400 in FIG. 4, the comparator 600 does not comprise the sampling capacitors Cs1-Cs4 and the switch $S_{RST}$ because input voltages of any other subsequent stage behind the first subsequent stage are close to DC voltages, so that sampling is not required. Except the capacitors Cs1-Cs4 and the switch $S_{RST}$, the comparator 600 is similar to the comparator 400. Please refer to the aforementioned embodiments to realize the components in the comparator 600.

Figure 7:
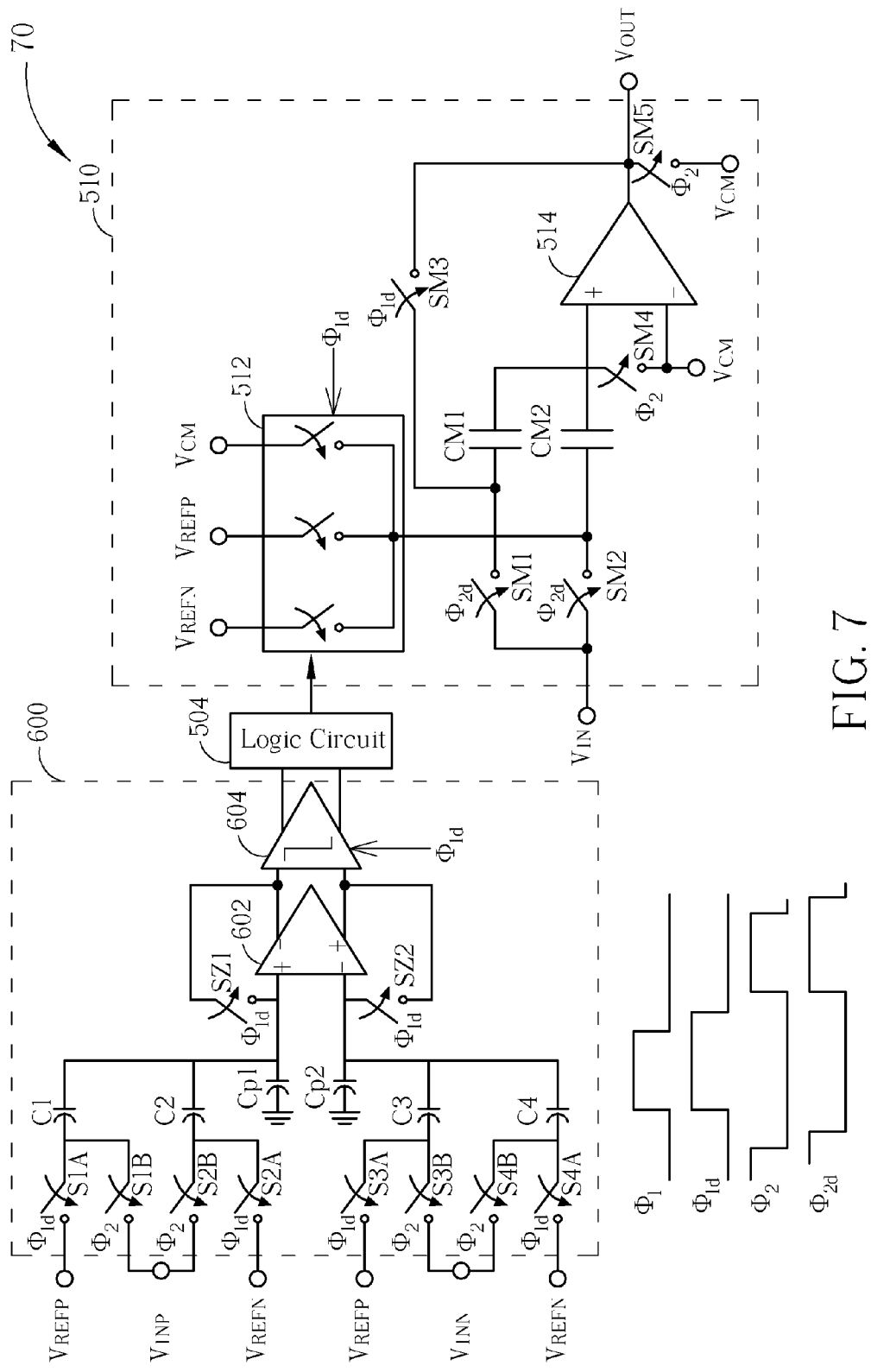
FIG. 7 and FIG. 8 are schematic diagrams of the second subsequent stage and the third subsequent stage behind the first subsequent stage shown in FIG. 5.

Note that, the comparator 600 can be utilized in the different subsequent stage, e.g. the second or the third subsequent stage, with different clock signals. Please refer to FIG. 7 and FIG. 8, which are schematic diagrams of the second subsequent stage 70 and the third subsequent stage 80 behind the first subsequent stage 50 in FIG. 5. The second subsequent stage 70 or the third subsequent stage 80 includes a sub-ADC including the comparator 600 in FIG. 6 and the logic circuit 504, and the multiplying DAC 510. Note that, in FIG. 7 and FIG. 8 only one comparator is illustrated for a simplified presentation. As shown in FIG. 7, in the subsequent stage 70, the clock signal $\Phi_2$ controls the switches in the comparator 600 to sample the differential input voltages $V_{INP}$ and $V_{INN}$. The clock signal $\Phi_{2d}$ controls the switches in the multiplying DAC 510 to sample the input voltage $V_{IN}$. The clock signal $\Phi_{1d}$ control the switches in the comparator 600 to sample the reference voltages $V_{REFP}$ and $V_{REFN}$. The latch circuit 604 latches the differential output voltages of the preamplifier 602 at the rising edge of the clock signal $\Phi_{1d}$.

Figure 8:
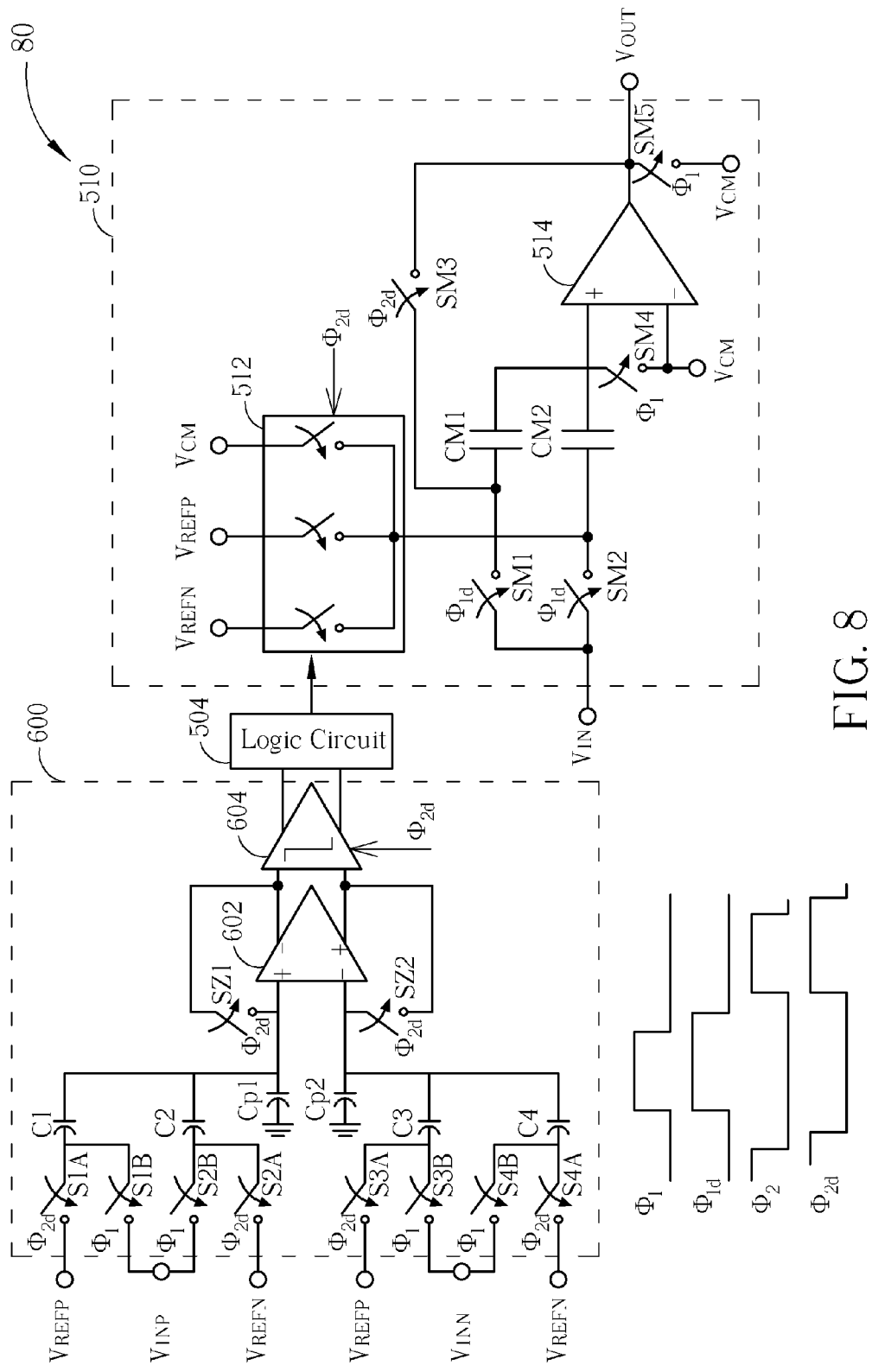

As shown in FIG. 8, in the third subsequent stage 80, the clock signal $\Phi_1$ controls the switches in the comparator 600 to sample the differential input voltages $V_{INP}$ and $V_{INN}$. The clock signal $\Phi_{1d}$ controls the switches in the multiplying DAC 510 to sample the input voltage $V_{IN}$. The clock signal $\Phi_{2d}$ control the switches in the comparator 600 to sample the reference voltages $V_{REFP}$ and $V_{REFN}$. The latch circuit 604 latches the differential output voltages of the preamplifier 602 at the rising edge of the clock signal $\Phi_{2d}$. Those skilled in the art can know how any other subsequent stage behind the third subsequent stage operates according to the clock signals $\Phi_1$, $\Phi_{1d}$, $\Phi_2$, and $\Phi_{2d}$, which are omitted herein.

Figure 9:
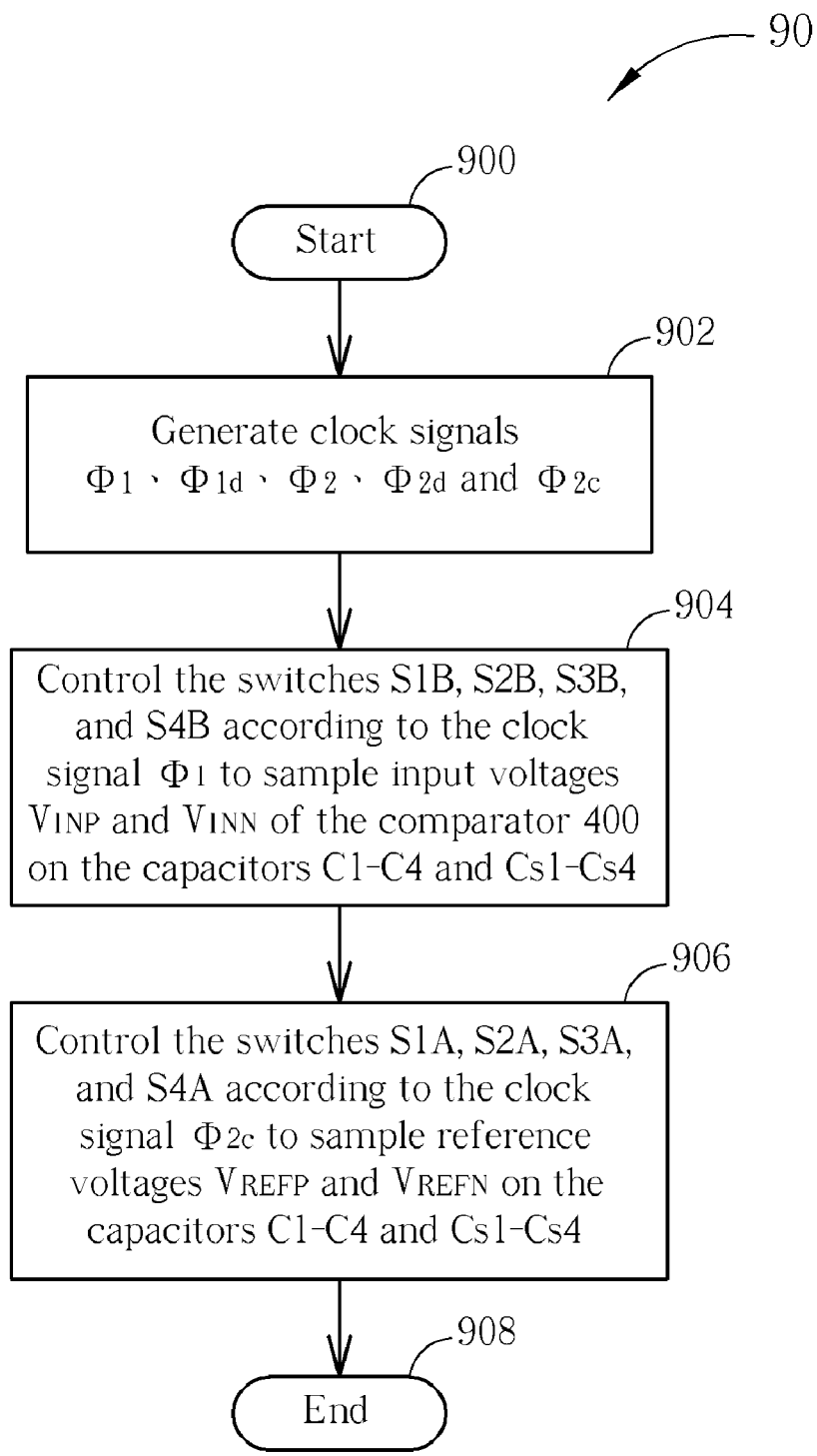
FIG. 9 is a flowchart of a process according to an embodiment of the present invention.

For implementing the comparator 400, not only the components in the comparator 400 but also the clock signals $\Phi_1$, $\Phi_{1d}$, $\Phi_2$, $\Phi_{2d}$, and $\Phi_{2c}$ are required. Please refer to FIG. 9, which is a flowchart of a process 90 according to an embodiment of the present invention. The process 90 illustrates operation of the switched capacitor circuit in the comparator 400, which comprises the following steps:

Step 900: Step.
Step 902: Generate clock signals $\Phi_1$, $\Phi_{1d}$, $\Phi_2$, $\Phi_{2d}$ and $\Phi_{2c}$.
Step 904: Control the switches S1B, S2B, S3B, and S4B according to the clock signal $\Phi_1$ to sample the positive input voltage $V_{INP}$ and the negative input voltage $V_{INN}$ of the comparator 400 on the capacitors C1-C4 and Cs1-Cs4.
Step 906: Control the switches S1A, S2A, S3A, and S4A according to the clock signal $\Phi_{2c}$ to sample the positive reference voltage $V_{REFP}$ and the negative reference voltage $V_{REFN}$ on the capacitors C1-C4 and Cs1-Cs4.
Step 908: End.

Please refer to the aforementioned embodiments to realize how the process 90 is performed. Through the process 90, the switched capacitor circuit of the comparator 400 can sample the differential input voltages and differential reference voltages on the capacitors at different time, so as to make the time constant for the comparator 400 only related to the equivalent resistance of the switch and the capacitance, and not related to the transconductance of the transistor Therefore, the aperture error is avoided.

In conclusion, when the first subsequent stage of a pipelined ADC applies the comparator and the process according to the present invention, the pipelined ADC does not require a front-end sample-and-hold amplifier, cost and power consumption of the pipelined ADC are therefore reduced. Preferably, the comparator according to the present invention provides a longer time for signal amplification and a time constant easy to be adjusted, so that the aperture error is obviously reduced. Compared with the conventional comparator, the comparator according to the present invention is more useful in high-speed application.

Those skilled in the art will readily observe that numerous modifications and alterations of the device and method may be made while retaining the teachings of the invention.

What is claimed is:

1. A comparator for a pipelined ADC comprising:
   a sampling circuit coupled to a plurality of differential input voltages and a plurality of differential reference voltages, for sampling the plurality of differential input voltages according to a first clock signal, and for sampling the plurality of differential reference voltages according to a second clock signal, the sampling circuit comprising
      a plurality of input voltage sampling switches, each input voltage sampling switch coupled to a corresponding one of the plurality of differential input voltages and controlled by the first clock signal;
      a plurality of reference voltage sampling switches, each reference voltage sampling switch coupled to a corresponding one of the plurality of differential reference voltages and controlled by the second clock signal;
      a plurality of first capacitors, each first capacitor comprising one terminal coupled to a corresponding one of the plurality of input voltage sampling switches and a corresponding one of the plurality of reference voltage sampling switches, and another terminal coupled to a corresponding one of the input terminals of the preamplifier; and
      a plurality of second capacitors, each second capacitor comprising one terminal coupled to a corresponding one of the plurality of input voltage sampling switches, a corresponding one of the plurality of reference voltage sampling switches, and a corresponding one of the plurality of first capacitors, and another terminal coupled to a ground;
   a preamplifier coupled to the sampling circuit comprising a positive input terminal, a negative input terminal, a positive output terminal, and a negative output terminal, for amplifying a voltage across the positive input terminal and the negative input terminal for generating a plurality of differential output voltages; and
   a latch circuit coupled to the preamplifier for latching the plurality of differential output voltages.

2. The comparator of claim 1, wherein the comparator is utilized in the first subsequent stage of the pipelined ADC.

3. The comparator of claim 1, wherein a time constant for the comparator is related to the equivalent resistance of each of the plurality of input voltage sampling switches and the capacitance of each of the plurality of second capacitors.

4. The comparator of claim 1 further comprising:
   a first switch coupled between the positive input terminal and the negative output terminal of the preamplifier and controlled by the second clock signal; and
   a second switch coupled between the negative input terminal and the positive output terminal of the preamplifier and controlled by the second clock signal.

5. The comparator of claim 1 further comprising:
   a switch coupled between the positive output terminal and the negative output terminal of the preamplifier and controlled by the first clock signal.

6. The comparator of claim 1, wherein the preamplifier starts amplifying the voltage across the positive input terminal and the negative input terminal at the falling edge of the first clock signal.

7. The comparator of claim 1, wherein the preamplifier comprises:
   a first n-type transistor comprising a drain coupled to a current source, a source coupled to a ground, and a gate coupled to the drain;
   a second n-type transistor comprising a drain, a source coupled to the ground, and a gate coupled to the gate of the first n-type transistor;
   a third n-type transistor comprising a drain, a source coupled to the drain of the second n-type transistor, and a gate which is the positive input terminal of the preamplifier;

a fourth n-type transistor comprising a drain, a source coupled to the drain of the second n-type transistor, and a gate which is the negative input terminal of the preamplifier;

a first p-type transistor comprising a source coupled to a voltage source, a drain, and a gate coupled to the drain;

a second p-type transistor comprising a source coupled to the voltage source, a drain, and a gate coupled to the drain;

a third p-type transistor comprising a source coupled to the voltage source, a drain coupled to the drain of the first p-type transistor, and a gate, wherein the drain of the third p-type transistor is the negative output terminal of the preamplifier; and a fourth p-type transistor comprising a source coupled to the voltage source, a drain coupled to the drain of the second p-type transistor and the gate of the third p-type transistor, and a gate coupled to the drain of the third p-type transistor, wherein the drain of the fourth p-type transistor is the positive output terminal of the preamplifier.

8. The comparator of claim 1, wherein the latch circuit latches the plurality of differential output voltages according to the second clock signal.

9. A signal sampling method for a pipelined ADC, wherein a comparator of the first subsequent stage of the pipelined ADC comprises a sampling circuit including a plurality of input voltage sampling switches, a plurality of reference voltage sampling switches, and a plurality of capacitors, the signal sampling method comprising:

controlling the plurality of input voltage sampling switches according to a first clock signal, for sampling a plurality of differential input voltages on the plurality of capacitors; and controlling the plurality of reference voltage sampling switches according to a second clock signal, for sampling a plurality of differential reference voltages on the plurality of capacitors, wherein the first clock signal and the second signal are non-overlapping signals, wherein the plurality of capacitors comprises:

a plurality of first capacitors, each first capacitor comprising one terminal coupled to a corresponding one of the plurality of input voltage sampling switches and a corresponding one of the plurality of reference voltage sampling switches, and another terminal coupled to a corresponding one of input terminals of a preamplifier in the comparator; and a plurality of second capacitors, each second capacitor comprising one terminal coupled to a corresponding one of the plurality of input voltage sampling switches, a corresponding one of the plurality of reference voltage sampling switches, and a corresponding one of the plurality of first capacitors, and another terminal coupled to a ground.

10. The signal sampling method of claim 9 further comprising:

generating the first clock signal, which is utilized in a subsequent stage of the pipelined ADC, for sampling input voltages of the subsequent stage;

generating a third clock signal, wherein the rising edge of the third clock signal and the rising edge of the first clock signal are at the same time, and the falling edge of the third clock signal is later than the falling edge of the first clock signal;

generating a fourth clock signal which is non-overlapping with the first clock signal, utilized in another subsequent stage adjacent to the subsequent stage, for sampling input voltages of the adjacent subsequent stage;

generating a fifth clock signal, wherein the rising edge of the fifth clock signal and the rising edge of the fourth clock signal are at the same time, and the falling edge of the fifth clock signal is later than the falling edge of the fourth clock signal; and generating the second clock signal according to the fifth clock signal, wherein the second clock signal is a delay clock of the fifth clock signal.

11. The signal sampling method of claim 10, wherein the first clock signal, the third clock signal, the fourth clock signal, and the fifth clock signal are further utilized in a plurality of subsequent stages of the pipelined ADC except the first subsequent stage.

12. The signal sampling method of claim 9, wherein a time constant for the comparator is related to the equivalent resistance of each of the plurality of input voltage sampling switches and the capacitance of each of the plurality of second capacitors.

13. The signal sampling method of claim 9 further comprising:

controlling a signal connection between a positive input terminal and a negative output terminal of a preamplifier in the comparator and a signal connection between a negative input terminal and a positive output terminal of the preamplifier according to the second clock signal, for cancelling a DC offset voltage across the positive input terminal and the negative input terminal of the preamplifier.

14. The signal sampling method of claim 9 further comprising:

controlling a signal connection between a positive output terminal and a negative output terminal of a preamplifier in the comparator according to the first clock signal, for resetting voltages on the positive output terminal and the negative output terminal.

* * * * *